(12) United States Patent
Kawao

(10) Patent No.: US 9,679,592 B2
(45) Date of Patent: Jun. 13, 2017

(54) FLEXURE OF DISK DRIVE SUSPENSION, AND METHOD OF MANUFACTURING CONDUCTIVE CIRCUIT PORTION OF FLEXURE

(71) Applicant: NHK SPRING CO., LTD., Yokohama-shi, Kanagawa (JP)

(72) Inventor: Sei Kawao, Aiko-gun (JP)

(73) Assignee: NHK SPRING CO., LTD., Tokyo (JP)

( * ) Notice: Subject to any disclaimer, the term of this patent is extended or adjusted under 35 U.S.C. 154(b) by 0 days.

(21) Appl. No.: 15/215,337

(22) Filed: Jul. 20, 2016

(65) Prior Publication Data

US 2017/0076745 A1    Mar. 16, 2017

(30) Foreign Application Priority Data

Sep. 10, 2015    (JP) .................................. 2015-178575

(51) Int. Cl.
G11B 5/48    (2006.01)
(52) U.S. Cl.
CPC ............ G11B 5/4833 (2013.01); G11B 5/486 (2013.01); G11B 5/4826 (2013.01)
(58) Field of Classification Search
CPC .......... G11B 5/48; G11B 5/486; G11B 5/4833
USPC ............................................. 360/245–245.9
See application file for complete search history.

(56) References Cited

U.S. PATENT DOCUMENTS

| | | | |
|---|---|---|---|
| 5,428,490 A | 6/1995 | Hagen | |
| 5,434,731 A | 7/1995 | Hagen | |
| 5,504,640 A | 4/1996 | Hagen | |
| 5,602,699 A | 2/1997 | Khan | |
| 5,638,234 A | 6/1997 | Hagen | |
| 5,923,500 A | 7/1999 | Hagen | |
| 5,995,329 A * | 11/1999 | Shiraishi | G11B 5/4826 360/245.9 |
| 6,046,887 A | 4/2000 | Uozumi et al. | |
| 6,397,455 B1 | 6/2002 | Hagen | |
| 8,462,464 B1 * | 6/2013 | Dunn | G11B 5/4833 360/245.9 |
| 9,047,895 B2 | 6/2015 | Yamaguchi | |
| 2002/0012202 A1 | 1/2002 | Hagen | |
| 2002/0034039 A1 | 3/2002 | Hagen | |
| 2002/0034051 A1 | 3/2002 | Hagen | |

(Continued)

FOREIGN PATENT DOCUMENTS

| | | |
|---|---|---|
| JP | 06203508 A | 7/1994 |
| JP | 09017139 A | 1/1997 |

(Continued)

*Primary Examiner* — Allen T Cao
(74) *Attorney, Agent, or Firm* — Holtz, Holtz & Volek PC

(57) ABSTRACT

A suspension includes a load beam and a flexure. The flexure has a metal base and a conductive circuit portion. The conductive circuit portion has an insulating layer formed on the metal base, and a conductor formed on the insulating layer. The conductive circuit portion includes a first region which constitutes a part of the conductive circuit portion in the longitudinal direction, and a second region which constitutes another part of the same in the longitudinal direction. The conductor includes a thin conductor portion having a first thickness arranged in the first region, and a thick conductor portion having a second thickness arranged in the second region. The second thickness is greater than the first thickness.

6 Claims, 11 Drawing Sheets

(56) References Cited

U.S. PATENT DOCUMENTS

| | | | | |
|---|---|---|---|---|
| 2010/0284112 A1* | 11/2010 | Ohwe | ................... | G11B 5/486 |
| | | | | 360/246.1 |
| 2010/0290160 A1* | 11/2010 | Arai | ................... | G11B 5/484 |
| | | | | 360/245.8 |
| 2013/0314821 A1* | 11/2013 | Arai | ................... | G11B 5/4873 |
| | | | | 360/244.5 |
| 2014/0368954 A1* | 12/2014 | Inoue | ................... | G11B 5/4853 |
| | | | | 360/234.5 |
| 2015/0241788 A1 | 8/2015 | Yamaguchi | | |
| 2016/0071533 A1* | 3/2016 | Kawao | ................... | G11B 21/16 |
| | | | | 360/245.9 |

FOREIGN PATENT DOCUMENTS

| | | | |
|---|---|---|---|
| JP | 11039626 | A | 2/1999 |
| JP | 2010067317 | A | 3/2010 |
| JP | 2012009111 | A | 1/2012 |
| JP | 2015001993 | A * | 1/2015 |

\* cited by examiner

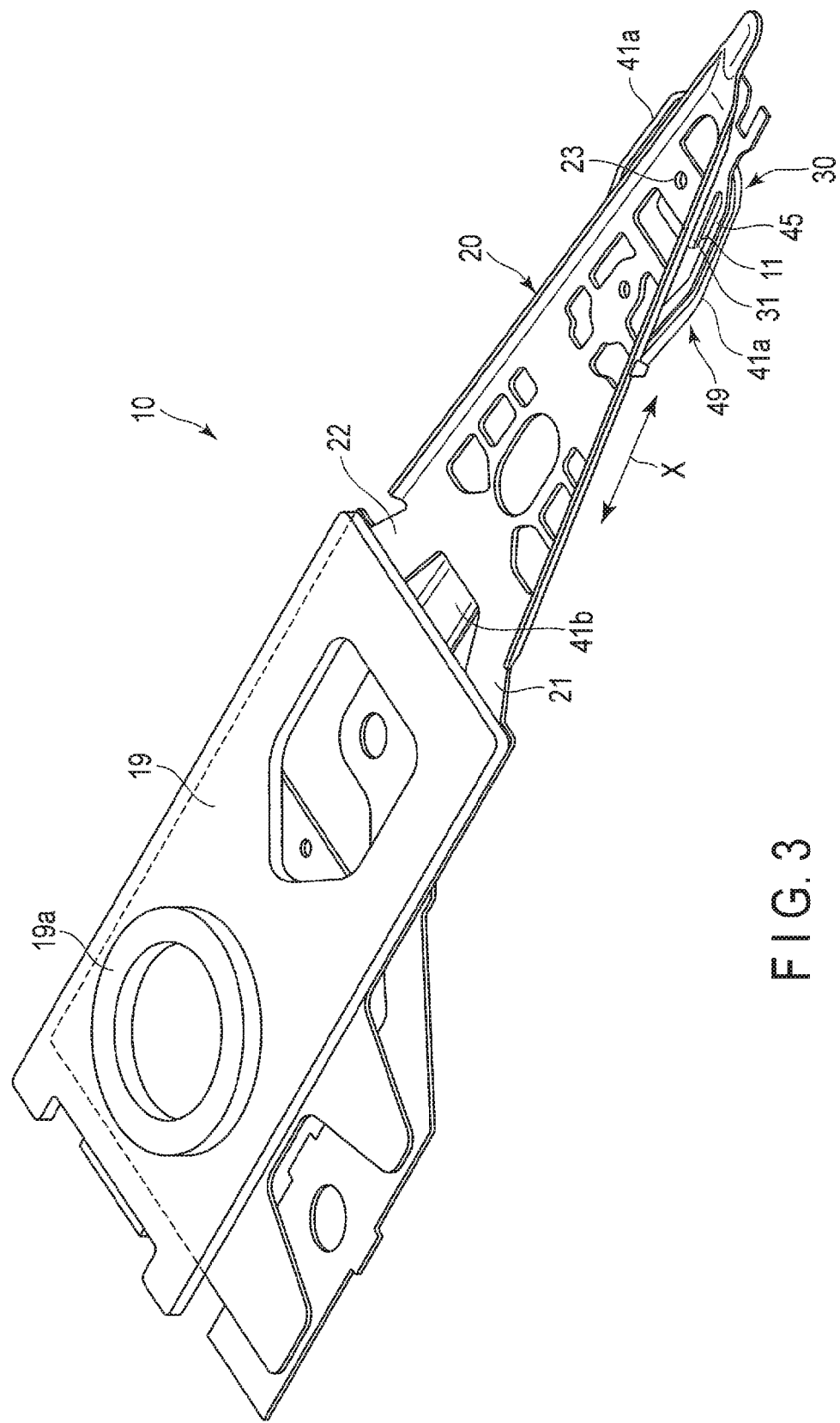
F I G. 3

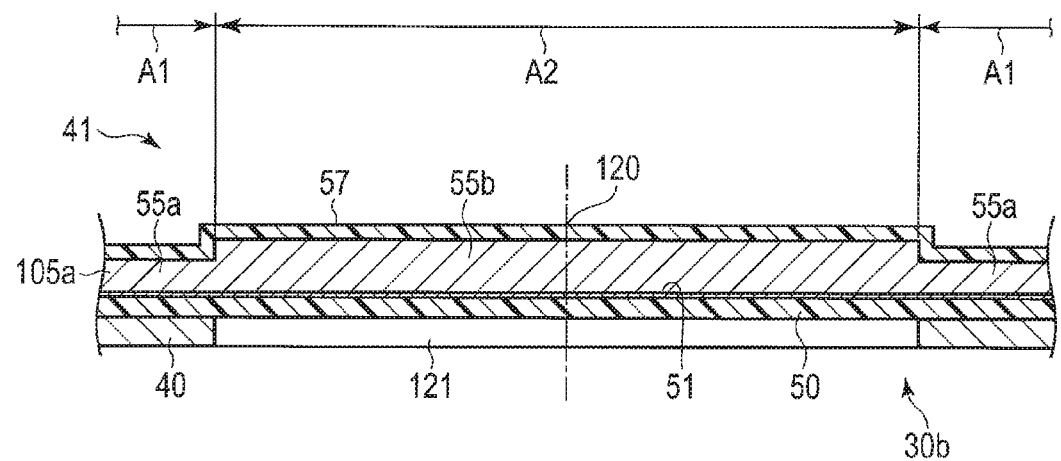
F I G. 20
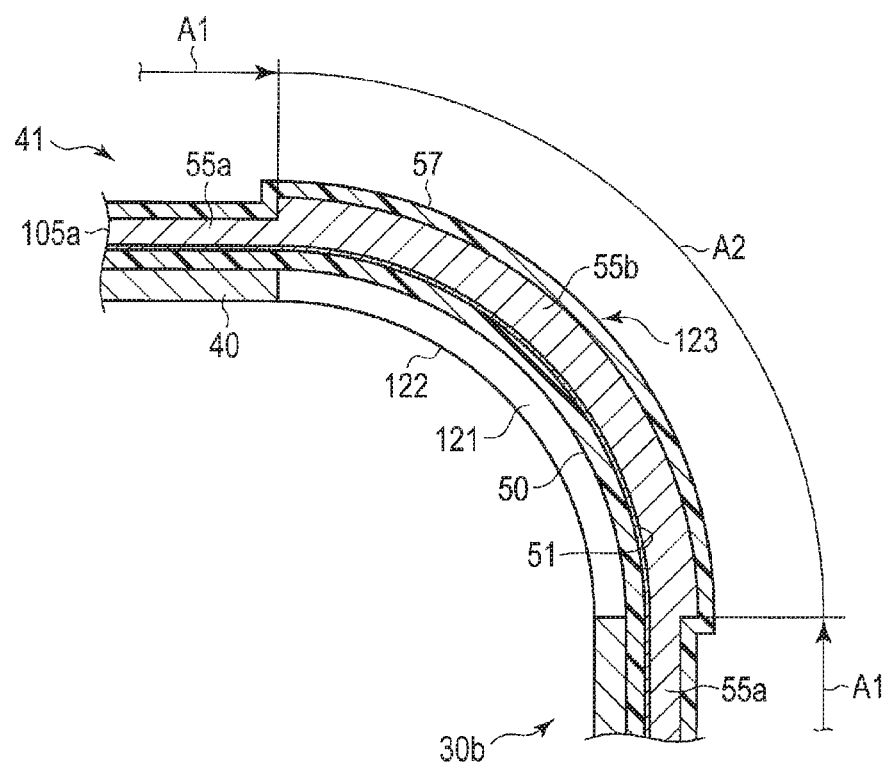
F I G. 21

FLEXURE OF DISK DRIVE SUSPENSION, AND METHOD OF MANUFACTURING CONDUCTIVE CIRCUIT PORTION OF FLEXURE

CROSS-REFERENCE TO RELATED APPLICATIONS

This application is based upon and claims the benefit of priority from prior Japanese Patent Application No. 2015-178575, filed Sep. 10, 2015, the entire contents of which are incorporated herein by reference.

BACKGROUND OF THE INVENTION

1. Field of the Invention

The present invention relates to a flexure of a disk drive suspension used for an information processor such as a personal computer, and a manufacturing method of the same.

2. Description of the Related Art

A hard disk drive (HDD) is used in an information processor such as a personal computer. The hard disk drive comprises a magnetic disk rotatable about a spindle, a carriage turnable about a pivot, etc. The carriage comprises an arm (an actuator arm), and is configured to be turned transversely relative to tracks of the disk about the pivot by a positioning motor such as a voice coil motor.

A suspension is mounted on the actuator arm. The suspension includes, for example, a load beam, and a flexure disposed to overlap the load beam. A slider, which constitutes a magnetic head, is mounted on a gimbal portion formed near a distal end of the flexure. The slider is provided with an element (transducer) for accessing data, that is, for reading or writing data. When a disk rotates, the slider is slightly lifted from a disk surface, whereupon an air bearing is formed between the disk and the slider.

In order to deal with high recording density of a disk, the hard disk drive has achieved reducing the flying height of a slider year by year. In order to stably realize a low flying height, it is extremely important to control the stiffness of a gimbal portion (around a tongue), and various means have been proposed from the past.

JP 6-203508 A (Patent Literature 1) discloses an example of a gimbal portion. The gimbal portion of Patent Literature 1 comprises a metal base made of stainless steel. By a half etching portion formed on the metal base, the stiffness of the gimbal portion is controlled. JP 9-17139 A (Patent Literature 2) discloses another example of a gimbal portion. The stiffness of the gimbal portion of Patent Literature 2 is controlled by optimizing a planar shape of a metal base.

Further, JP 11-39626 A (Patent Literature 3) also discloses an example of a gimbal portion. The gimbal portion of Patent Literature 3 comprises a pair of outriggers. At an interior of the pair of outriggers, a conductive circuit portion is arranged. By optimizing the shape of the conductive circuit portion and the shape of a metal base, the stiffness of the gimbal portion is controlled. Also, a gimbal portion disclosed in JP 2012-9111 A (Patent Literature 4) reduces the stiffness by thinning an insulating layer (base polyimide) of an unsupported conductive circuit portion.

JP 2010-67317 A (Patent Literature 5) discloses an example of a suspension substrate. In the suspension substrate of Patent Literature 5, of a plurality of conductors arranged parallel to each other, the thickness of a part of the conductors is increased and the thickness of the remainder of the conductors is reduced. As the means for forming conductors whose thicknesses are different from each other, after forming a first resist pattern having a height corresponding to a thickness of a thin conductor by a first masking process, the thin conductor (a thin copper layer) is formed by first copper plating. After that, in a second masking process, a second resist pattern for a thick conductor is formed on the first resist pattern. After that, by second copper plating which uses the second resist pattern, a thick conductor (a thick copper layer) is formed.

With conventional techniques described in Patent Literatures 1 to 3, the stiffness has been reduced by reducing the thickness of the metal base, or slimming a planar shape of the metal base. However, there is a limit to thinning or slimming of the conductive circuit portion in order to satisfy the required electrical properties. If the stiffness of the metal base is reduced, the stiffness of the gimbal portion can be reduced. However, if the stiffness of the metal base is reduced, the degree of influence that the stiffness of the conductive circuit portion relatively has over the stiffness of the gimbal portion (i.e., a stiffness contribution ratio of the conductive circuit portion) is increased. Thus, the degree of freedom of design for obtaining desired stiffness of the gimbal portion is adversely affected. Ideally, if the stiffness contribution ratio of the conductive circuit portion that affects the stiffness of the gimbal portion is zero, it is easy to optimize the stiffness of the gimbal portion.

As described in Patent Literature 4, one option of reducing the stiffness of the gimbal portion is by reducing the thickness of the insulating layer (base polyimide) of the unsupported conductive circuit portion formed around the tongue. However, partially reducing the thickness of polyimide is technically difficult. As the means for reducing the stiffness of the conductive circuit portion, one possibility is not to use a cover layer (cover polyimide) which covers a conductor. However, since the cover polyimide is as thin as several micrometers, even if the cover layer is removed, achieving sufficiently reduced stiffness cannot be accomplished.

The unsupported conductive circuit portion around the tongue does not have a metal base. For this reason, if only gold-plated conductors are used in the unsupported conductive circuit portion, it is possible to reduce the stiffness around the tongue. However, the unsupported conductive circuit portion constituted of only the conductors cannot control relative positions of the conductors which are adjacent to each other. Therefore, because of variations in the distance between the conductors, there arise problems that the electrical characteristics of the unsupported conductive circuit portion are adversely affected, and the conductors are easily deformed.

In Patent Literature 5 described above, in the conductive circuit portion comprising a plurality of conductors, one of the conductors and the other conductor are made to have different thicknesses. However, Patent Literature 5 does not relate to a technology of forming a portion having a different thickness in a longitudinal direction of a conductor. That is, in Patent Literature 5, in forming a thin conductor and a thick conductor, a first resist pattern having the same height as that of the thin conductor is formed, and a thin copper layer is formed by using the first resist pattern. After that, by overlaying a second resist pattern for forming the thick conductor on the first resist pattern, a thick copper layer is formed by using the second resist pattern. Accordingly, if the positions of the first resist pattern and the second resist pattern are deviated even if only slightly, a step portion or a discontinuous portion is formed on a side surface of the thick conductor (copper layer). Such a step portion or discontinuous portion causes the electrical or mechanical characteristics to deteriorate, and in an extreme case, the aforementioned portions may be a starting point of disconnection.

BRIEF SUMMARY OF THE INVENTION

An object of the present invention is to provide a flexure of a disk drive suspension capable of improving the mechanical characteristics such as flexibility, and also the electrical characteristics, and a method of manufacturing a conductive circuit portion of the flexure.

An embodiment relates to a flexure mounted on a load beam of a disk drive suspension, wherein the flexure comprises a metal base formed of a stainless-steel plate, and a conductive circuit portion arranged along the metal base; and the conductive circuit portion comprises an insulating layer formed of an electrically insulating material (for example, polyimide) and formed on the metal base, and a conductor is layer of copper for plating) formed on the insulating layer. Further, the conductor comprises a than conductor portion formed in a first region which constitutes a part of the conductive circuit portion in a longitudinal direction, and a thick conductor portion, which is formed in the conductor at a second region which constitutes another part of the conductive circuit portion in the longitudinal direction, and whose thickness is greater than that of the thin conductor portion.

This structure enables the mechanical characteristics to be improved, such as enabling the stiffness of an unsupported conductive circuit portion arranged around a tongue or a flexible conductive circuit portion arranged near a hinge portion to be reduced. The thick conductor portion can be arranged at a place where an opening is formed in the metal base as in a bent portion of a flexure tail portion. In that case, because of a great thickness of a conductor in an area facing the opening, the impedance can be reduced, and the electrical characteristics are improved, such as the impedance matching is expedited.

In one embodiment, the flexure may comprise a gimbal portion comprising a tongue; the conductive circuit portion may include an unsupported conductive circuit portion (an example of the first region) without a metal base which is arranged along the tongue; and the unsupported conductive circuit portion may comprise the thin conductor portion. Also, the load beam may comprise a pair of hinge portions; the conductive circuit portion may include a flexible conductive circuit portion (an example of the first region) arranged between the hinge portions; and the flexible conductive circuit portion may comprise the thin conductor portion.

Also, the flexure may comprise a flexure tail portion; the flexure tail portion may comprise an opening formed in the metal base, a bent portion of the metal base which is bent in a thickness direction at the opening, and a trace curved portion (an example of the second region) which is curved in the thickness direction at a position facing the opening; and the trace curved portion may comprise the thick conductor portion.

Further, in another embodiment, the conductor may comprise a terminal portion (an example of the second region) which is connected to a terminal of an electronic circuit, and the terminal portion may comprise the thick conductor portion. Also, the conductive circuit portion may comprise a plurality of conductors arranged to be spaced apart from each other in a width direction of the conductive circuit portion, and the plurality of conductors may comprise a thin conductor portion formed in a part of the conductors, and a thick conductor portion formed in the remainder of the conductors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a perspective view showing an example of a disk drive suspension according to a first embodiment.

FIG. 20 is a cross-sectional view of a portion to be bent of the flexure tail portion shown in FIG. 19.

FIG. 21 is a cross-section view showing the state in which the portion to be bent shown in FIG. 20 is bent by approximately 90°.

DETAILED DESCRIPTION OF THE INVENTION

First Embodiment

FIGS. 1 to 14

A flexure of a disk drive suspension according to a first embodiment will be hereinafter described with reference to FIGS. 1 to 14.

Figure 1:
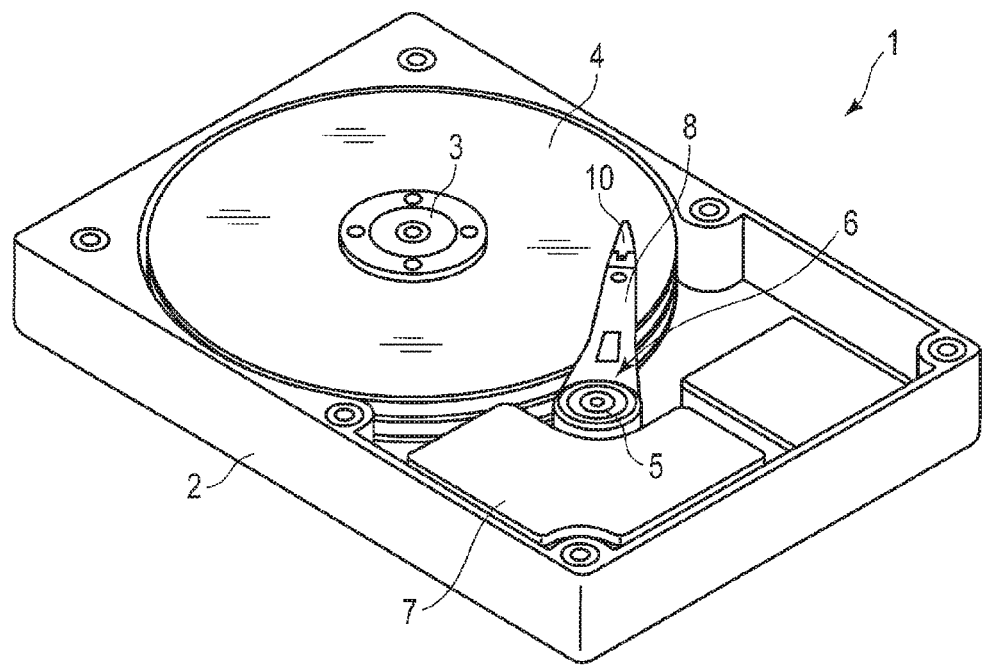
FIG. 1 is a perspective view showing an example of a disk drive.

A disk drive (HDD) 1 shown in FIG. 1 comprises a case 2, disks 4 rotatable about a spindle 3, a carriage 6 which turns about a pivot 5, and a positioning motor 7 for turning the carriage 6. The case 2 is sealed by a lid which is not shown.

Figure 2:
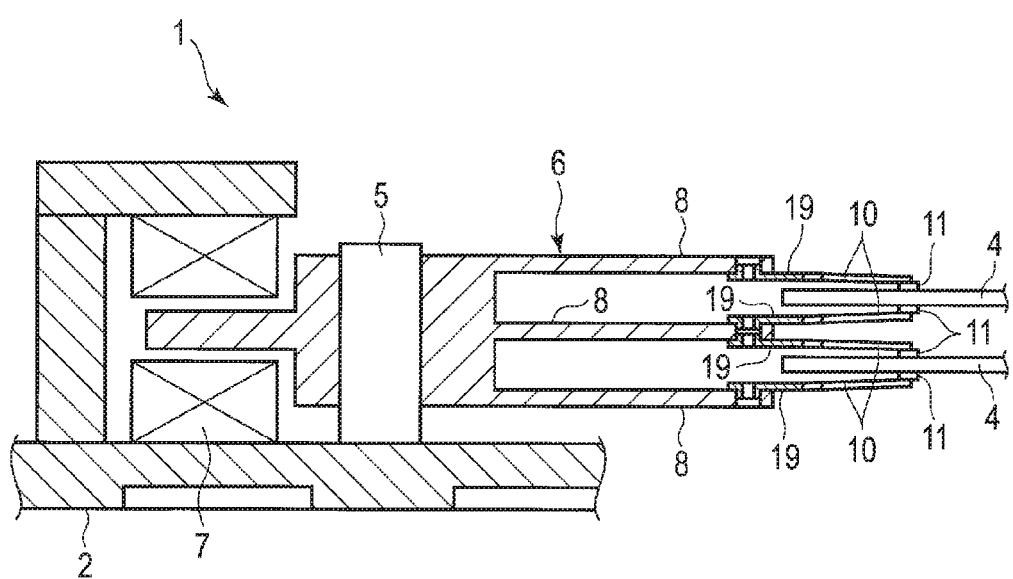
FIG. 2 is a cross-sectional view of a part of the disk drive shown in FIG. 1.

FIG. 2 is a cross-sectional view schematically showing a part of the disk drive 1. The carriage 6 is provided with arms 8. At a distal end portion of each arm 8, a disk drive suspension (hereinafter simply referred to as a suspension) 10 is mounted. At a distal end portion of the suspension 10, a slider 11 is provided. As each disk 4 rotates at high speed, an air bearing is formed between the disk 4 and the slider 11. If the carriage 6 is turned by the positioning motor 7, the suspension 10 moves radially relative to the disk 4, and the slider 11 thereby moves to a desired track of the disk 4.

FIG. 3 shows an example of the suspension 10. The suspension 10 comprises a baseplate 19, a load beam 20, and a flexure 30 with conductors mounted on the load beam 20. In the present specification, the flexure 30 with conductors may be simply referred to as the flexure 30. The load beam 20, the flexure 30, etc., constitute a head gimbal assembly.

A boss portion 19a of the baseplate 19 is secured to the arm 8 (FIGS. 1 and 2) of the carriage 6. A pair of hinge portions 21 and 22 is formed on the load beam 20. The hinge portions 21 and 22 have such springiness that they can be deformed resiliently in the thickness direction. The direction indicated by arrow X in FIG. 3 is a longitudinal direction (front-rear direction) of the suspension 10, that is, a longitudinal direction of the load beam 20. The load beam 20 is, for example, 30 to 100 μm thick. A dimple 23 is formed near a distal end of the load beam 20.

Figure 4:
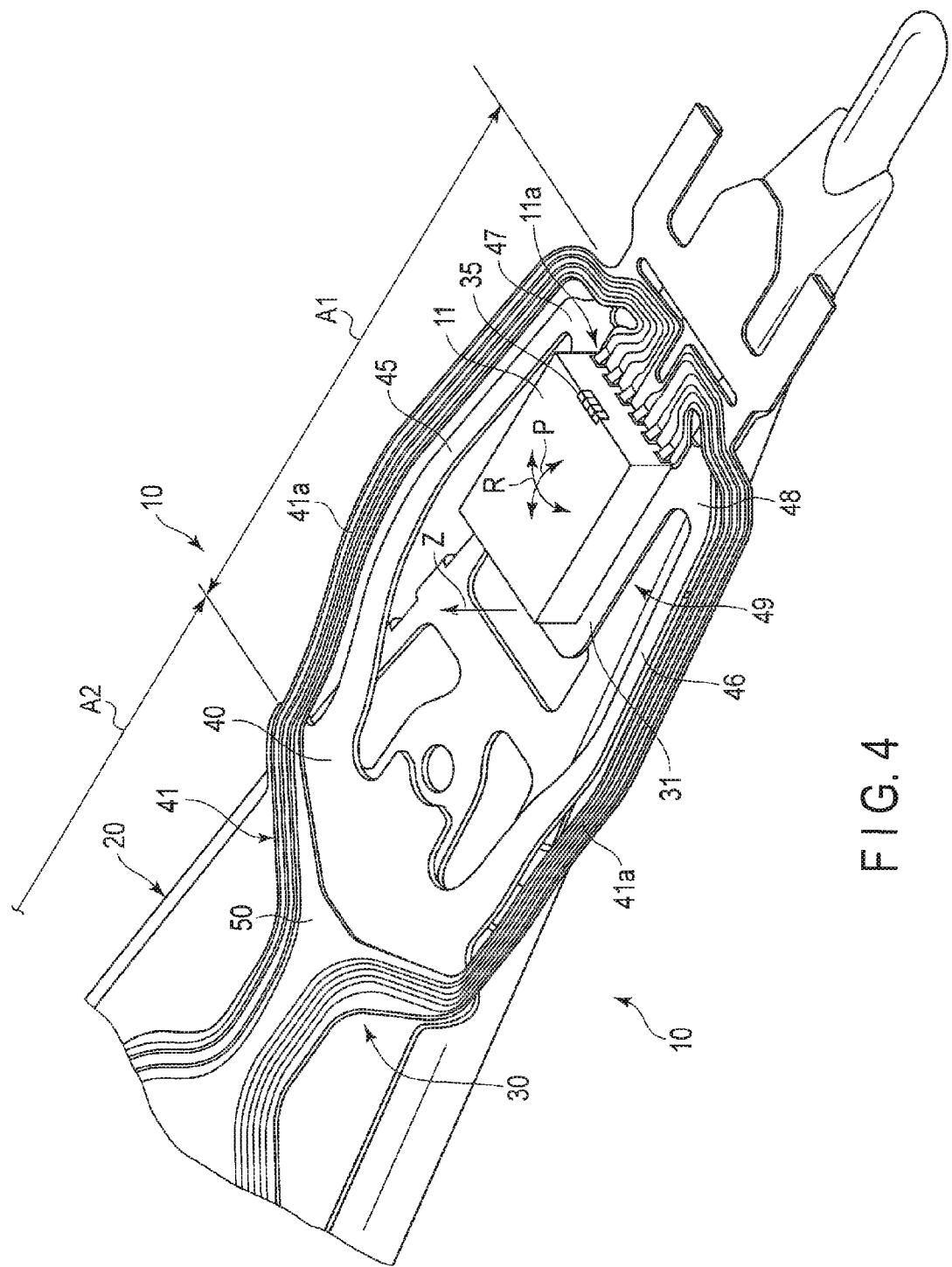
FIG. 4 is a perspective view of a distal end portion of the suspension shown in FIG. 3 as seen from the side opposite to FIG. 3.

FIG. 4 is a perspective view of the distal end portion of the suspension 10 as seen from the side opposite to FIG. 3. A tongue 31 is formed near a distal end of the flexure 30. The slider 11 is mounted on the tongue 31. At a distal end of the slider 11, an element group 35 which serves as a magnetic head is provided.

The element group 35 includes a write element (for example, a magnetic coil) which records data on the disk 4, and a read element which reads data recorded on the disk 4. An example of the read element is a magnetoresistive (MR) element. The MR element converts a magnetic signal recorded on the disk 4 into an electrical signal. That is, access such as writing or reading of data to and from the disk 4 is performed by the element group 35.

The flexure 30 includes a metal base 40, and a conductive circuit portion 41 arranged along the metal base 40. The metal base 40 is formed of a stainless-steel plate which is thinner than the load beam 20. For example, the metal base 40 formed of a stainless-steel rolled plate having a thickness of approximately 10 to 25 μm is secured to the load beam 20 by laser welding, and the like.

As shown in FIG. 4, outrigger portions 45 and 46 are formed on both sides of the tongue 31. The tongue 31 and the outrigger portions 45 and 46 all constitute a part of the metal base 40, and have springiness. The tongue 31 and the outrigger portions 45 and 46 are connected to each other via continuous portions 47 and 48. As shown in FIG. 3, the dimple 23 is formed on the load beam 20. The tongue 31 swingably moves in a rolling direction R (FIG. 4) and a pitching direction P with a top of the dimple 23 being a fulcrum. The tongue 31 and the outrigger portions 45 and 46 constitute a gimbal portion 49 which swingably supports the slider 31.

Figure 5:
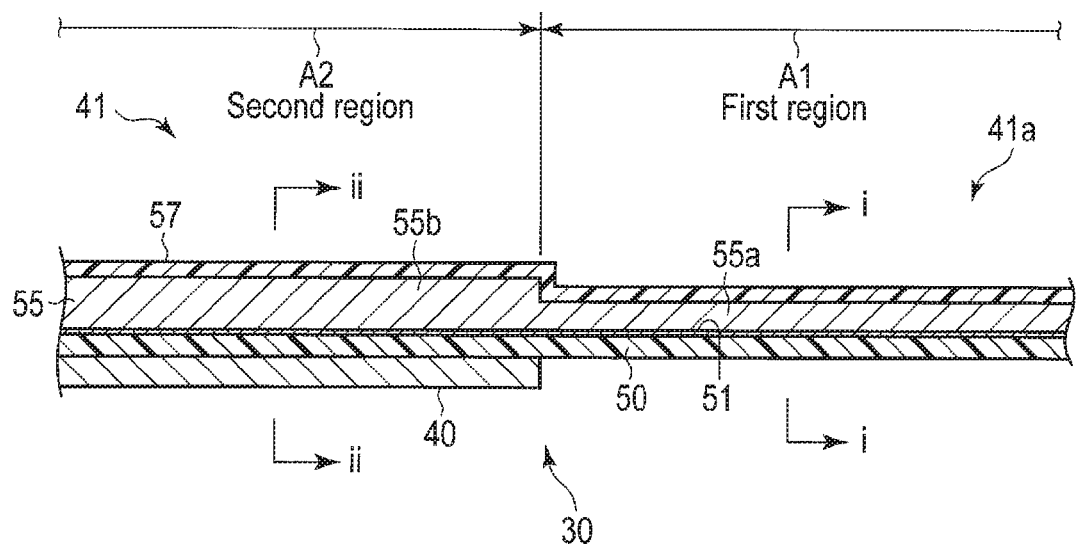
FIG. 5 is a cross-sectional view of the distal end portion of the suspension shown in FIG. 4 along a longitudinal direction of the conductive circuit portion.
Figure 6:
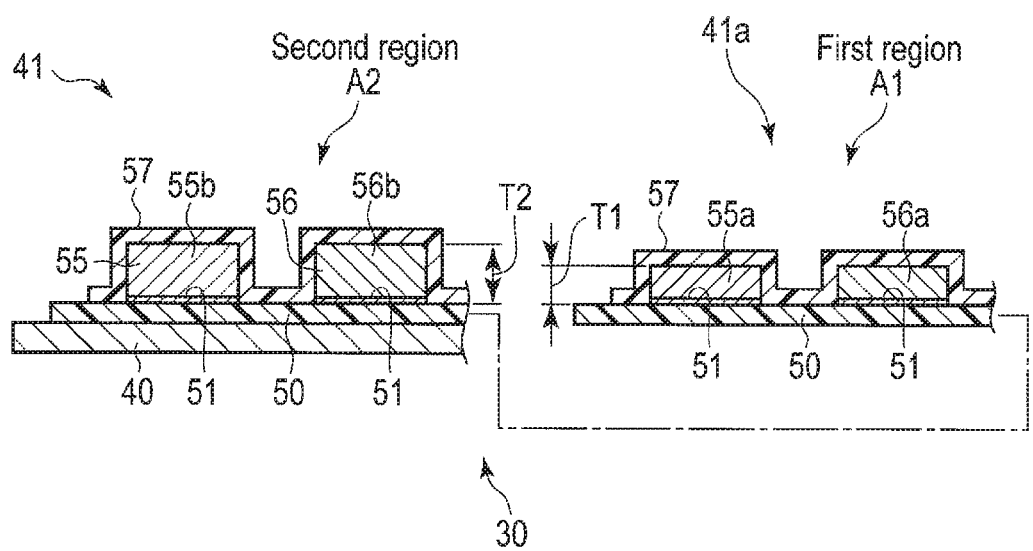
FIG. 6 is a cross-sectional view of the conductive circuit portion showing a cross-section of a first region taken along line i-i of FIG. 5, and a cross-section of a second region taken along line ii-ii of the same.

As shown in FIG. 5, an unsupported conductive circuit portion 41a is formed at a part of the conductive circuit portion 41 of the flexure 30. FIG. 5 shows a cross-section of the unsupported conductive circuit portion 41a along the longitudinal direction. The right half of FIG. 6 is a cross-sectional view of the conductive circuit portion 41 taken along line i-i of FIG. 5, and the left half of the same is a cross-sectional view of the conductive circuit portion 41 taken along line ii-ii of FIG. 5.

The conductive circuit portion 41 includes insulating layer 50 formed on the metal base 40, an extremely thin conductive film 51 formed on the insulating layer 50, conductors 55 and 56 formed on the conductive film 51, and a cover layer 57 covering the conductors 55 and 56. The insulating layer 50 and the cover layer 57 are both made of an electrically insulating material, such as polymide.

The thickness of the insulating layer 50 is 5 to 20 μm (for example, 10 μm). The conductive film 51 is formed of an extremely thin metal (for example, nickel) formed by sputtering, for example. The thickness of the conductive film 51 is 0.01 μm or less. The thickness of each of the conductors 55 and 56 is 4 to 15 μm (for example, 5 μm). The thickness of the cover layer 57 is 2 to 10 μm (for example, 4 μm). The conductors 55 and 56 are electrically connected to terminals 11a (FIG. 4) of the slider 11. Further, although more than one (for example, eight to twelve) conductor exists in the actual conductive circuit portion 41, for convenience of explanation, two conductors, i.e., conductors 55 and 56, are shown as a typical example of the conductors, in order to facilitate understanding.

The conductive circuit portion 41 includes a first region A1 which constitutes a part of the conductive circuit portion 41 in the longitudinal direction, and a second region A2 which constitutes another part of the conductive circuit portion 41 in the longitudinal direction. An example of the first region A1 is the unsupported conductive circuit portion 41a. The unsupported conductive circuit portion 41a is arranged along the outrigger portion 45 and 46 around the tongue 31.

As shown in FIGS. 5 and 6, the unsupported conductive circuit portion 41a includes the insulating layer 50, the conductive film 51, the conductors 55 and 56 (only a part of which is shown) and the cover layer 57. In the first region A1 (the unsupported conductive circuit portion 41a), the metal base 40 is not provided in order to reduce the stiffness. In other words, an example of the first region A1 is the unsupported conductive circuit portion 41a without a metal base. The metal base 40 is provided in the second region A2.

The thicknesses of the conductors (copper layers) 55 and 56 in the first region A1 are different from those of the second region A2. That is, in the first region A1 (the unsupported conductive circuit portion 41a), thin conductor portions 55a and 56a each having thickness T1 (FIG. 6) are arranged. In the second region A2, thick conductor portions 55a and 56b each having thickness T2 are arranged. Thickness T2 of each of the thick conductor portions 55b and 56b is greater than thickness T1 of each of the thin conductor portions 55a and 56a.

As can be seen, in the present embodiment, the thin conductor portions 55a and 56a are arranged in the unsupported conductive circuit portion 41a which constitutes the first region A1. The unsupported conductive circuit portion 41a is not provided with the metal base 40. Consequently, with respect to the conductive circuit portion 41 of the flexure 30 of the present embodiment, the bending stiffness of the unsupported conductive circuit portion 41a around the tongue 31 can be reduced. Importance is placed on decreasing the spring constant of the unsupported conductive circuit portion 41a. The thin conductor portions 55a and 56a are part of the conductors (copper layers) 55 and 56 in the longitudinal direction. As the thin conductor portions 55a and 56a are arranged in the unsupported conductive circuit portion. 41a, the spring constant of the unsupported conductive circuit portion 41a can be decreased. Therefore, the degree of influence of the conductive circuit portion 41 upon the gimbal movement of the tongue 31 can be reduced, which facilitates control of the gimbal movement.

A method of manufacturing the conductive circuit portion 41 will now be described with reference to FIGS. 7 to 14. FIGS. 7 to 14 schematically illustrate how the conductive circuit portion 41 shown in FIG. 6 is manufactured in the order of manufacturing processes. Although there exists more than one (for example, eight to twelve) conductor in the conductive circuit portion 41, in order to facilitate understanding, only a pair of conductors, i.e., the conductors 55 and 56, will be described as a typical example of the conductors. The other conductors can be manufactured similarly.

Figure 7:
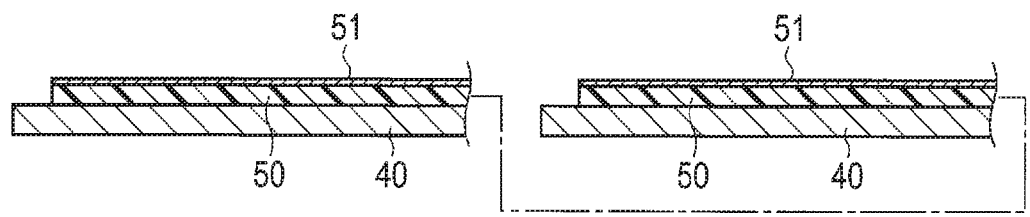
FIG. 7 is a cross-sectional view of a metal base, an insulating layer, and a conductive film before a resist is provided in a manufacturing process of the conductive circuit portion shown in FIG. 6.

As shown in FIG. 7, the insulating layer 50 made of base polyimide is formed on the metal base 40 made of stainless steel. The conductive film 51 is formed by metal film formation means such as sputtering on the insulating layer 50.

(1) First Masking Process

Figure 8:
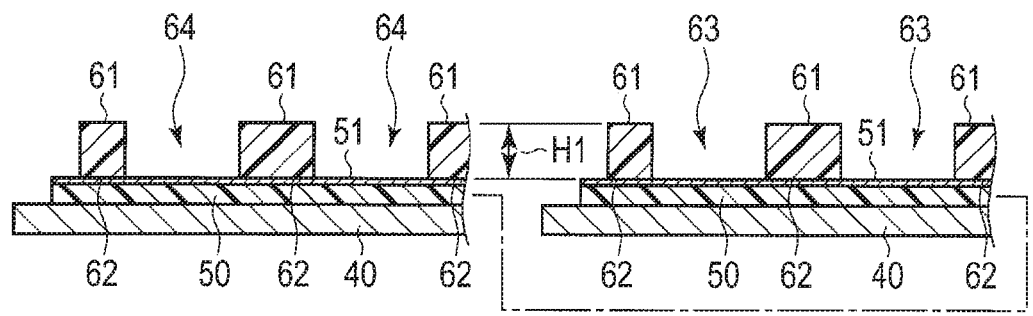
FIG. 8 is a cross-sectional view showing the state in which a first resist is provided on the insulating layer shown in FIG. 7.

As shown in FIG. 8, a first resist 61 corresponding to a predetermined conductor pattern is formed on the conductive film 51. The first resist 61 is formed to have height H1 corresponding to thickness 12 of each of the thick conductor portions 55b and 56b (FIG. 6). This is a first masking process. By the first masking process, on the conductive film 51, a masking portion 62, a thin conductor formation space 63, and a thick conductor formation space 64 are formed. The masking portion 62 is covered by the first resist 61. Neither of the thin conductor formation space 63 and the thick conductor formation space 64 is covered by the first resist 61.

(2) First Plating Process

Figure 9:
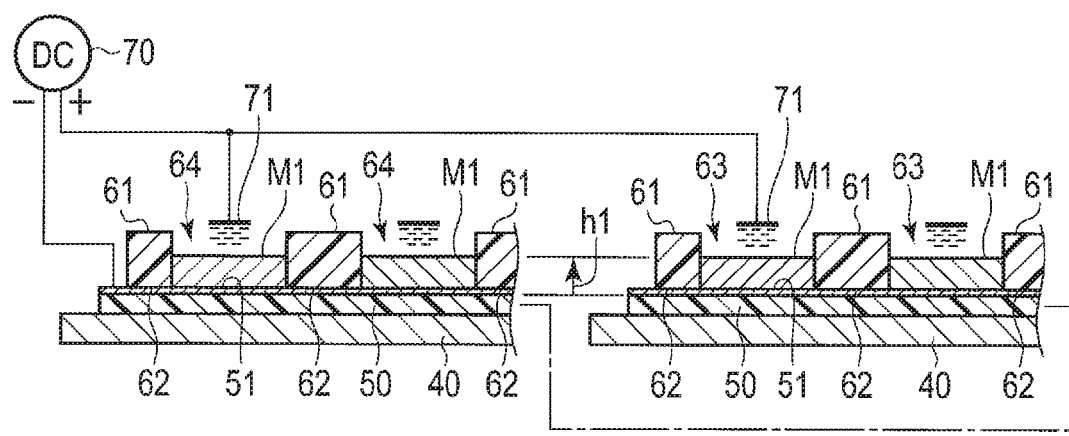
FIG. 9 is a cross-sectional view showing the state in which a plated layer having a first thickness is formed.

In a first plating process, as shown in FIG. 9, copper is plated onto the conductive film 51 of the thin conductor formation space 63 and the conductive film 51 of the thick conductor formation space 64 by electroplating. That is, by using a direct-current power supply 70 and a copper plating solution 71 (only a part of which is shown), plating is performed with copper up to a height of thickness 11 of each of the thin conductor portions 55a and 56a (FIG. 6). By this first plating process, a plated layer M1 having a first thickness h1 is formed in both the thin conductor formation space 63 and the thick conductor formation space 64. The first thickness h1 is the same as thickness T1 of each of the thin conductor portions 55a and 56a. The first thickness h1 is less than height H1 of the first resist 61.

(3) Second Masking Process

Figure 10:
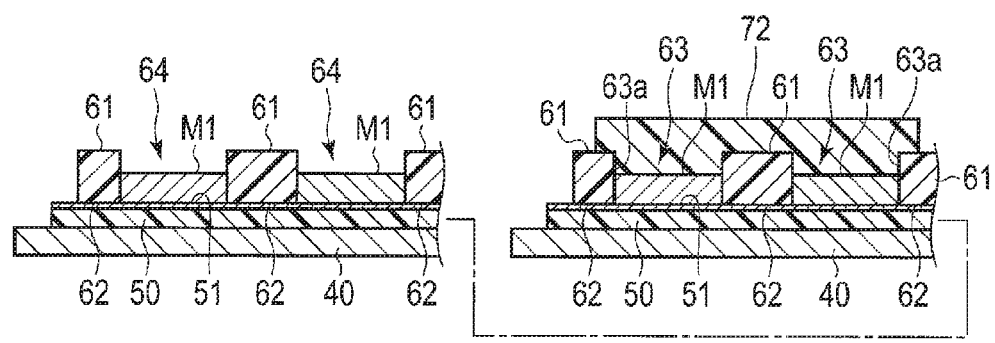
FIG. 10 is a cross-sectional view showing the state in which an opening of a thin conductor formation space is filled with a second resist.

As shown in FIG. 10, by filling an opening 63a of the thin conductor formation space 63 with a second resist 72, the plated layer M1 within the thin conductor formation space 63 is covered.

(4) Second Plating Process

Figure 11:
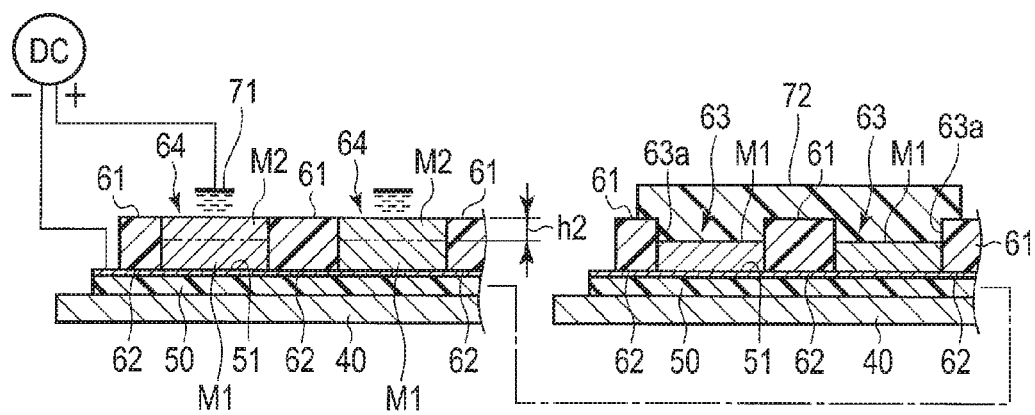
FIG. 11 is a cross-sectional view showing the state in which an additional plated layer is formed on a plated layer within a thick conductor formation space.

As shown in FIG. 11, the plated layer M1 within the thick conductor formation space 64 is not covered by the second resist 72. In a second plating process, an additional plated layer M2 having a second thickness h2 is formed on the plated layer M1 within the thick conductor formation space 64. In the second plating process, likewise the first plating process, the direct-current power supply 70 and the copper plating solution 71 (only a part of which is shown) are used. By the second plating process, the thick conductor portions 55b and 56b having a total thickness of T2 (FIG. 6) are formed within the thick conductor formation space 64. The plated layer M1 within the thin conductor formation space 63 is covered by the second resist 72. Accordingly, the thickness of the plated layer M1 within the thin conductor formation space 63 is not increased.

(5) Process of Removing Resist

Figure 12:
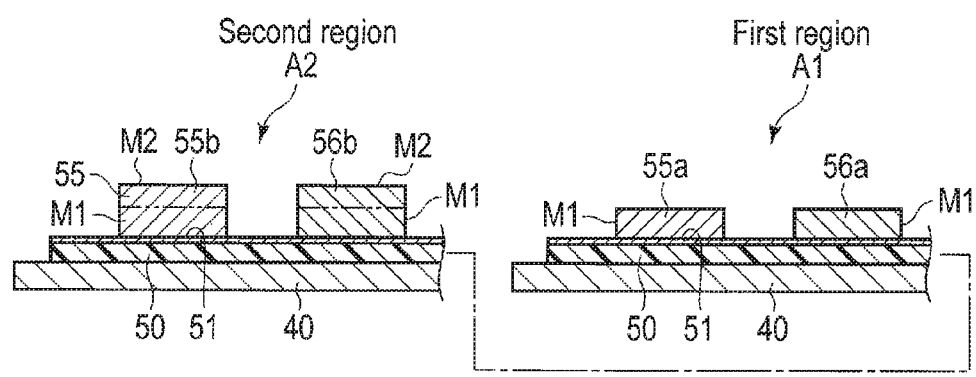
FIG. 12 is a cross-sectional view showing the state in which the first resist and the second resist are removed.

By removing the first resist 61 and the second resist 72, side surfaces of the conductors 55 and 56 are exposed, as shown in FIG. 12.

(6) Process of Removing Conductive Film

Figure 13:
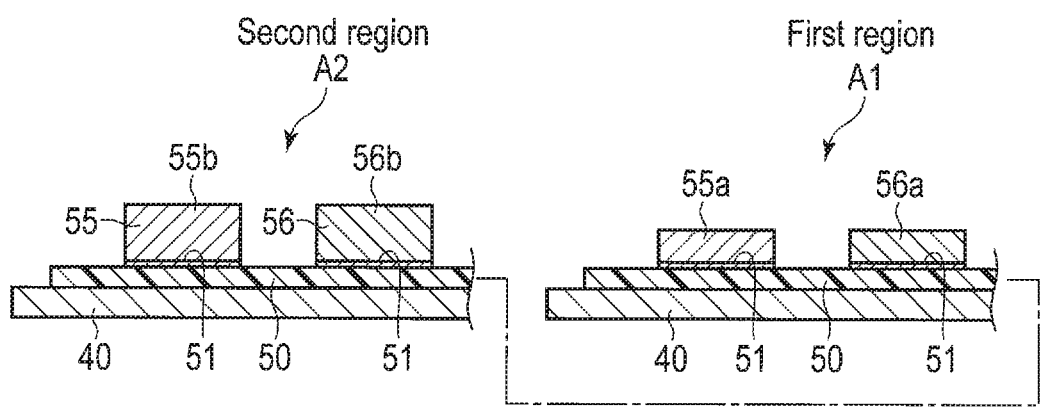
FIG. 13 is a cross-sectional view showing the state in which a conductive film provided between adjacent conductors is removed.

As shown in FIG. 13, the conductive film 51 between the conductors 55 and 56 is removed. As the conductive film 51 is removed, the conductors 55 and 56 are electrically insulated from each other.

(7) Process of Forming Cover Layer

Figure 14:
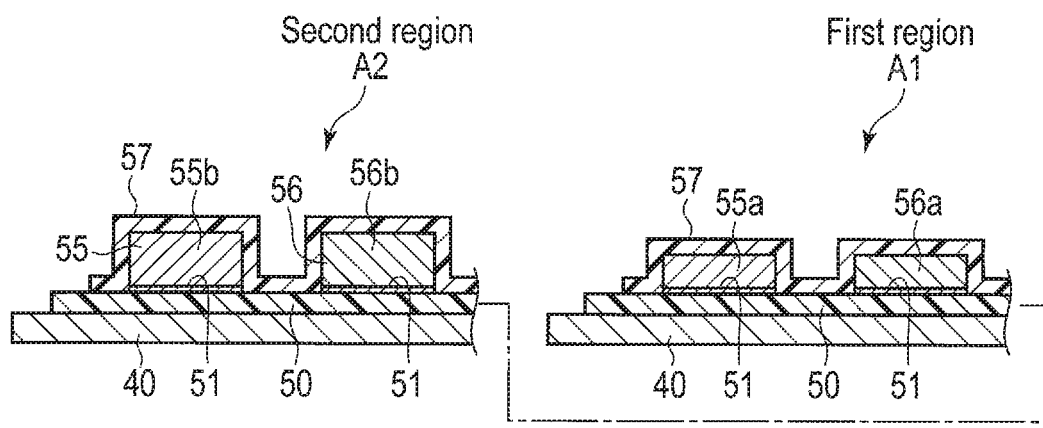
FIG. 14 is a cross-sectional view showing the state in which the conductors are covered by a cover layer.

As shown in FIG. 14, by forming the cover layer 57, the conductors 55 and 56 are covered by the cover layer 57.

(8) Process of Removing Part of Metal Base

By removing the metal base 40 (FIG. 14) of the first region A1 (the unsupported conductive circuit portion 41a) by etching, etc., the unsupported conductive circuit portion 41a (FIG. 6) is formed.

According to a method of manufacturing the conductive circuit portion as described above, the first resist 61 having height H1 corresponding to thickness T2 of each of the thick conductor portions 55b and 56b is formed in the first masking process. After the first resist 61 has been formed, by way of the first plating process and the second plating process, the thick conductor portions 55b and 56b are formed. In other words, even if the second plating process for forming the thick conductor portions 55b and 56b is carried out after the first plating process, the side surfaces of the thick conductor portions 55b and 56b (the side surface of the copper for plating) are prevented from having a step portion or a discontinuous portion. That is, the thick conductor portions 55b and 56b can be formed with a high degree of accuracy.

Second Embodiment

FIG. 15

Figure 15:
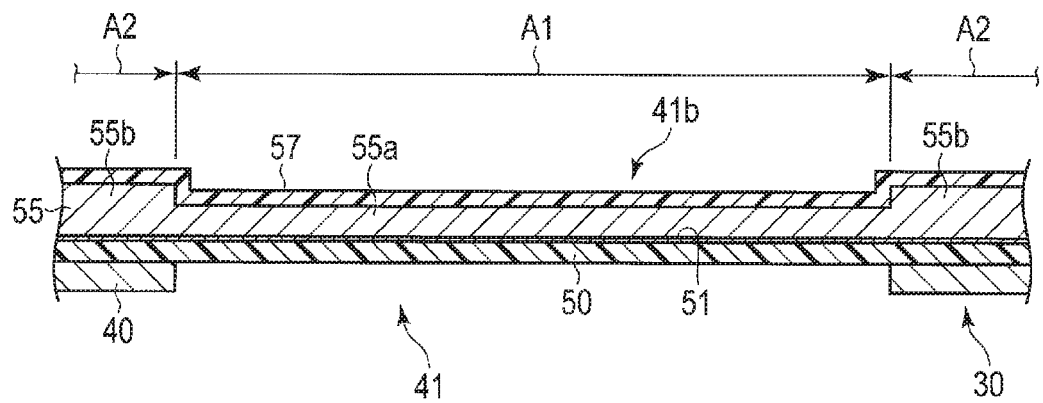
FIG. 15 is a cross-sectional view snowing a part of a conductive circuit portion (a flexible conductive circuit portion) according to a second embodiment.

FIG. 15 shows a first region A1 and a second region A2 of a conductive circuit portion 41 according to a second embodiment. The first region A1 of the present embodiment is located at a flexible conductive circuit portion 41b between hinge portions 21 and 22 (FIG. 3) The hinge portions 21 and 22 are required to be flexible (i.e., that the bending stiffness be small). A thin conductor portion 55a is formed in the flexible conductive circuit portion 41b (first region A1) between the hinge portions 21 and 22. The flexible conductive circuit portion 41b (first region A1) is not provided with a metal base 40 in order to reduce the stiffness.

By the flexible conductive circuit portion 41b structured as described above, the bending stiffness of the flexible conductive circuit portion 41b along the hinge portions 21 and 22 can be reduced. Thus, the degree of influence of the flexible conductive circuit portion 41b upon the spring properties of the hinge portions 21 and 22 can be reduced. Importance is placed on decreasing the spring constant of the flexible conductive circuit portion 41b between the hinge portions 21 and 22. The present embodiment accomplishes reduction of the spring constant of the flexible conductive circuit portion 41b by arranging the thin conductor portion 55a in the flexible conductive circuit portion 41b.

Third Embodiment

FIG. 16

Figure 16:
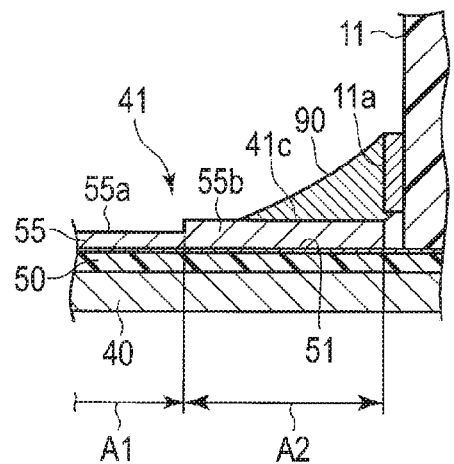
FIG. 16 is a cross-sectional view showing a terminal portion of a conductive circuit portion according to a third embodiment.

FIG. 16 shows a conductive circuit portion 41 according to a third embodiment. The conductive circuit portion 41 of the present embodiment comprises a terminal portion 41c, which is connected to a terminal 11a of a slider 11. The slider 11 is an example of an electronic component having an electronic circuit. In the terminal portion 41c serving as a second region A2 of the conductive circuit portion 41, a thick conductor portion 55b is arranged. The terminal portion 41c and the terminal lie of the slider 11 are connected to each other by a conductive member 90 such as solder. It is necessary to reliably establish electrical connection between the terminal portion 41c of the conductive circuit portion 41 and the terminal lie of the electronic circuit. Because the thick conductor portion 55b is arranged in the terminal portion 41c, a state of connection of the terminal portion 41c and the terminal 11a of the electronic circuit, which is brought about by the conductive member 90, can be made good. The present embodiment can also be applied to a connection part between a terminal of an electronic circuit other than the slider 11 and the terminal portion 41c of the conductive circuit portion 41.

Fourth Embodiment

FIG. 17

Figure 17:
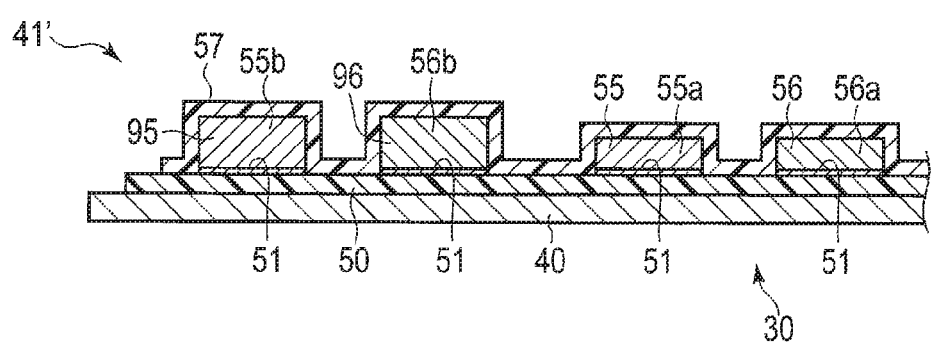
FIG. 17 is a cross-sectional view of a conductive circuit portion of a flexure according to a fourth embodiment.

FIG. 17 shows a conductive circuit portion 41' according to a fourth embodiment. A plurality of conductors 55, 56, 95, and 96 are arranged to be spaced apart from each other in a width direction of the conductive circuit portion 41'. Of these conductors 55, 56, 95, and 96, thin conductor portions 55a and 56a are formed in the conductors 55 and 56 in which a relatively small current flows. The thin conductor portions 55a and 56a are formed by a manufacturing method (FIGS. 7 to 13) described in the first embodiment. Of these conductors 55, 56, 95, and 96, thick conductor portions 55b and 56b are formed in the conductors 95 and 96 in which a relatively large current flows. That is, the conductive circuit portion 41 includes a plurality of conductors whose thicknesses are different from each other. The direct-current resistance (DCR) of the thick conductor portions 55b and 56b is smaller than that of the thin conductor portions 55a and 56a. Accordingly, such a thick conductor portion is advantageous to a trace having a conductor in which a relatively large current flows as compared to the other traces, such as a thermal flying-height control (TFC) trace or a microwave assisted magnetic recording (MAMR) trace. In a direct-current trace such as a write trace, a read trace, or a sensor trace, the thick conductor portions 55b and 56b may be used. By using the thick conductor portions 55b and 56b, it is possible to reduce the electrical resistance, thereby reducing power consumption.

Fifth Embodiment

FIGS. 18 to 21

FIGS. 18 to 21 show a suspension 10A according to a fifth embodiment. In the fifth embodiment, common reference numbers are added to designate parts which are the same as those of the suspension 10 of the first embodiment, and explanations of those parts will be omitted.

Figure 18:
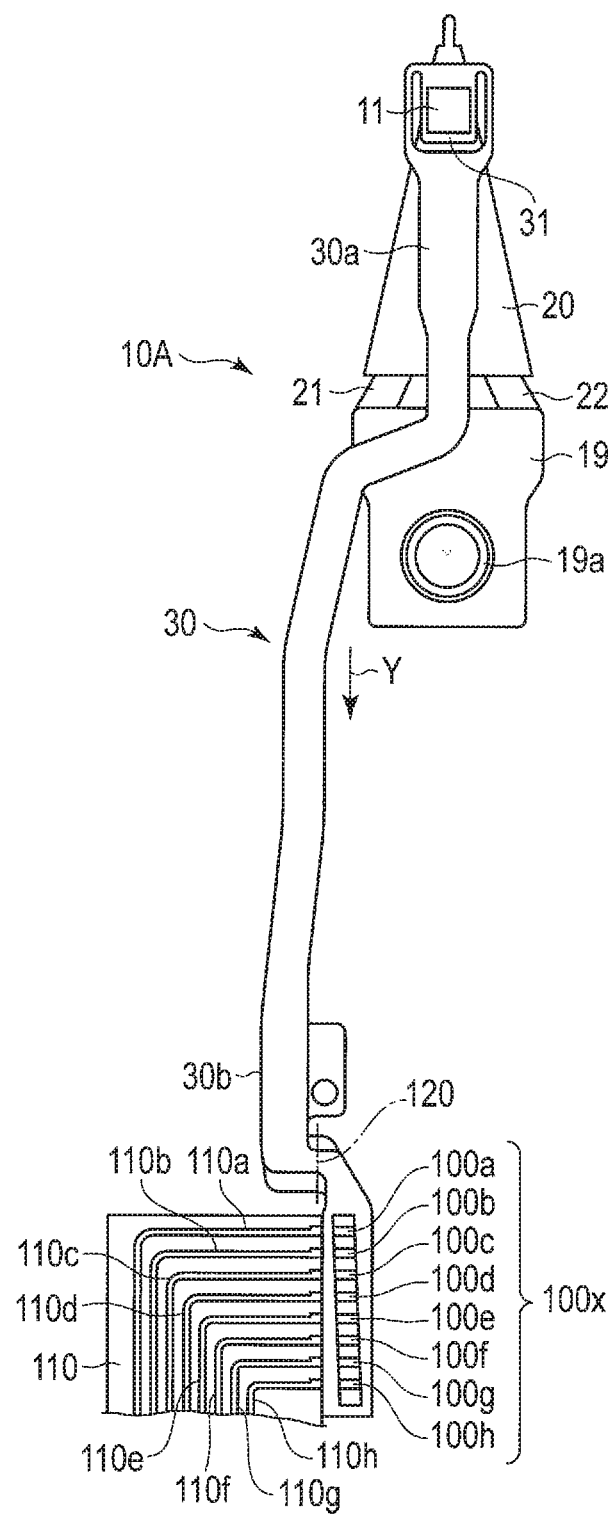
FIG. 18 is a plan view of a disk drive suspension according to a fifth embodiment.

A flexure 30 of the suspension 10A shown in FIG. 18 includes a proximal portion 30a secured to a load beam 20, and a flexure tail portion 30b. The flexure tail portion 30b extends toward the back of a baseplate 19 (i.e., in the direction indicated by arrow Y in FIG. 18) from the proximal portion 30a.

Figure 19:
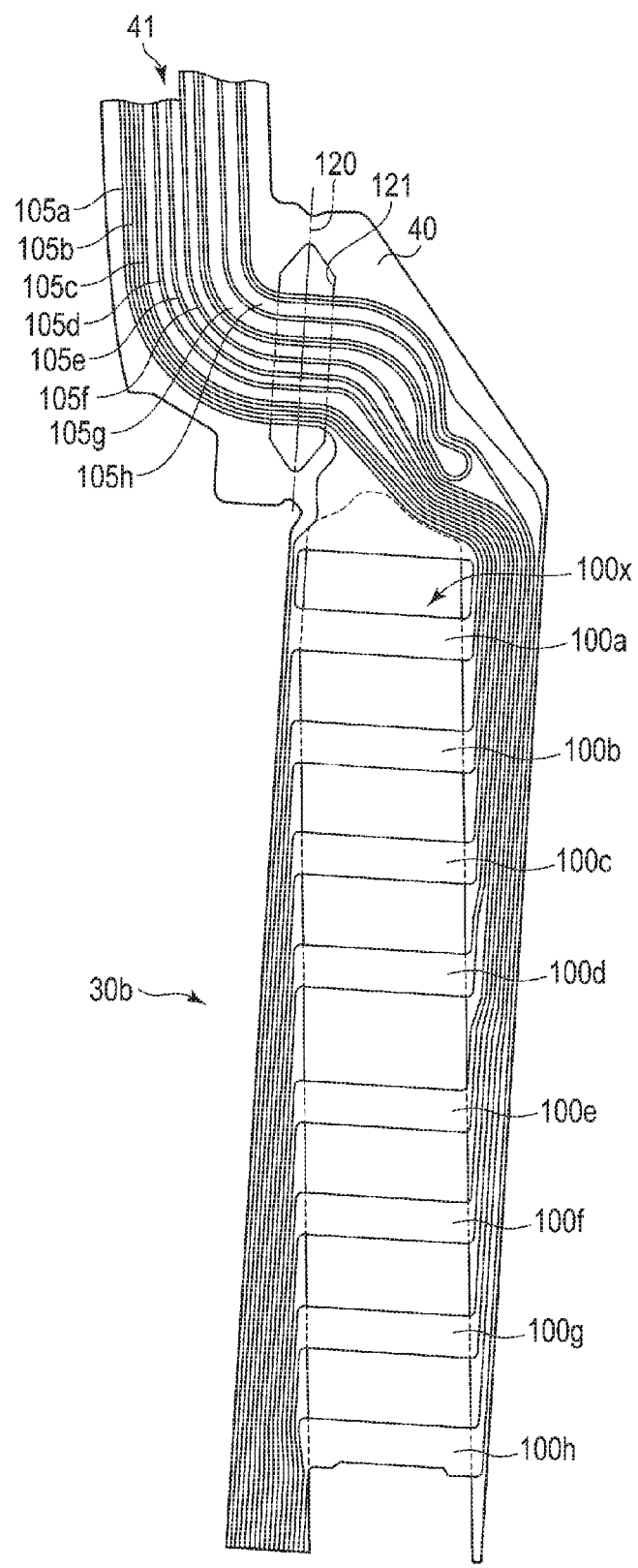
FIG. 19 is a plan view showing a metal base and conductors of a flexure tail portion of the suspension shown in FIG. 18 in an enlarged scale.

FIG. 19 indicates a tail terminal group 100x formed in the flexure tail portion 30b. An example of the tail terminal group 100x includes a ground tail terminal 100a, sensor tail terminals 100b and 100c, read tail terminals 100d and 100e, a heater tail terminal 100f, and write tail terminals 100g and 100h. The tail terminals 100a to 100h electrically conduct to conductors 105a to 105h of a conductive circuit portion 41, respectively. Note that in FIG. 19, in order to make the positional relationship between a metal base 40 and the tail terminals 100a to 100h easier to understand, an insulating layer 50 and a cover layer 57 are omitted.

The tail terminals 100a to 100h are connected to conductors 110a to 110h of a circuit board 110 (FIG. 18), respectively. An example of the circuit board 110 is a flexible printed circuit board (FPC). A preamplifier which constitutes a part of a signal processing circuit is mounted on the circuit board 110. A write current which is output from the preamplifier is supplied to a write element (a magnetic coil) of a slider 11 via the write tail terminals 100g and 100h. An electrical signal detected by a read element (MR element) of the slider 11 is input, to the preamplifier via the read tail terminals 100d and 100e and the conductors 110d and 110e of the circuit board 110.

The tail terminals 100a to 100h are connected to the conductors 110a to 110h of the circuit board 110. Depending on the positional relationship between the flexure tail portion 30b and the circuit board 110, at a portion to be bent 120 shown by a two-dot chain line in FIG. 19, the flexure tail portion 30b may be bent by approximately 90 degrees, for example, in the thickness direction. Therefore, in the portion to be bent 120 of the metal base 40, an oblong opening 121 extending in a width direction of the metal base 40 is formed.

FIG. 20 illustrates a part of the flexure tail portion 30b (around the portion to be bent 120) before the flexure tail portion 30b is bent, and shows a cross-section of the conductive circuit portion 41 along the longitudinal direction. The flexure tail portion 30b includes the metal base 40 having the opening 121, and the conductive circuit portion 41 formed on the metal base 40. The conductive circuit portion 41 includes the insulating layer 50, the conductors 105a to 105h (FIG. 19), and the cover layer 57 covering the conductors 105a to 105h. The conductors 105a to 105h are formed on the insulating layer 50 via a conductive film 51.

As shown in FIG. 21, the metal base 40 of the flexure tail portion 30b is bent by approximately 90 degrees, for example, in the thickness direction at the opening 121. Thereby, a bent portion 122 is formed in the metal base 40. That is, the conductive circuit portion 41 of the flexure tail portion 30*b* comprises the bent portion 122 and a trace curved portion 123. The bent portion 122 is a place where the metal base 40 is bent in the thickness direction at the opening 121. The trace curved portion 123 is curved in the thickness direction of the conductive circuit portion 41 at a position facing the opening 121. In each of the conductors 105*a* to 105*h* (FIG. 19), a thick conductor portion 55*b* is formed. The thick conductor portion 55*b* is formed in the trace curved portion 123 (a second region A2) facing the opening 121.

In the present embodiment (FIG. 21), the opening 121 is formed in the metal base 40. Accordingly, the metal base 40 can easily be bent at the portion to be bent 120. Moreover, the conductors 105*a* to 105*h* (FIG. 19) can be prevented from having excessive stress. In the second region A2 facing the opening 121, the thick conductor portion 55*b* is arranged. In this case, because the conductor in an area facing the opening 121 is thick, it is possible to reduce the impedance. Therefore, electrical characteristics can be improved, such as being able to expedite impedance matching (achieving constant impedance) of the conductive circuit portion 41. Also, if the conductive circuit portion has the same width, by employing the thick conductor portion 55*b*, achieving low impedance (electrical power saving) is enabled. In the case of the same impedance, as the width of a conductive circuit portion is reduced by using the thick conductor portion 55*b*, space saving of the conductive circuit portion is achieved. That is, by arranging the thick conductor portion 55*b* at an area where the electrical properties are emphasized such as in the trace curved portion 123 facing the opening 121, the electrical properties of the conductive circuit portion 41 can be improved irrespective of the spring constant.

Needless to say, in carrying out the present invention, as well as the specific shape and arrangement of the metal base and conductive circuit portion which constitute the flexure, the positions of the first region and the second region, and the specific forms of the insulating layer, the conductors, etc., may be modified variously. In addition, the thin conductor portion and the thick conductor portion may be formed in accordance with the mechanical or electrical characteristics required for the conductive circuit portion, and are not limited to the above embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flexure mounted on a load beam of a disk drive suspension, the flexure comprising:
 a metal base formed of a stainless-steel plate; and
 a conductive circuit portion arranged along the metal base,
 the conductive circuit portion comprising:
  an insulating layer formed of an electrically insulating material and formed on the metal base; and
  a conductor formed on the insulating layer,
 the conductor comprising:
  a thin conductor portion formed in a first region which constitutes a part of the conductive circuit portion in a longitudinal direction; and
  a thick conductor portion formed in a second region which constitutes another part of the conductive circuit portion in the longitudinal direction, a thickness of the thick conductor portion being greater than that of the thin conductor portion,
 wherein:
  the flexure comprises a gimbal portion comprising a tongue; and
  the conductive circuit portion includes an unsupported conductive circuit portion without a metal base which is arranged along the tongue, the unsupported conductive circuit portion comprising the thin conductor portion.

2. The flexure of claim 1, wherein:
 the flexure comprises a flexure tail portion;
 the flexure tail portion comprises:
  an opening formed in the metal base;
  a bent portion of the metal base which is bent in a thickness direction at the opening; and
  a trace curved portion which is curved in the thickness direction at a position facing the opening; and
 the trace curved portion comprises the thick conductor portion.

3. The flexure of claim 1, wherein:
 the conductor comprises a terminal portion which is connected to a terminal of an electronic circuit; and
 the terminal portion comprises the thick conductor portion.

4. The flexure of claim 1, wherein:
 the conductive circuit portion comprises a plurality of conductors formed on the insulating layer and arranged to be spaced apart from each other in a width direction of the conductive circuit portion; and
 the plurality of conductors comprise:
  thin conductor portions formed in a part of the conductors, the thin conductor portions being formed in a region which constitutes the part of the conductive circuit portion in the longitudinal direction; and
  thick conductor portions formed in a remainder of the conductors, the thick conductor portions being formed in a region which constitutes the another part of the conductive circuit portion in the longitudinal direction, a thickness of each of the thick conductor portions being greater than that of each of the thin conductor portions.

5. A method of manufacturing a conductive circuit portion of a flexure, the flexure comprising a metal base, the conductive circuit portion comprising an insulating layer formed on the metal base, and a conductor formed on the insulating layer, the conductor comprising a thin conductor portion formed in a part of the conductor in a longitudinal direction, and a thick conductor portion formed in another part of the conductor in the longitudinal direction, the method of manufacturing the conductive circuit portion comprising:
 a first masking process of forming a first resist, a height of the first resist corresponding to a thickness of the thick conductor portion, on the insulating layer, thereby forming a masking portion which is covered by the first resist, and a thin conductor formation space and a thick conductor formation space which are not covered by the first resist;
 a first plating process of plating each of the thin conductor formation space and the thick conductor formation space with copper up to a thickness of the thin conductor portion, thereby forming a plated layer having a first thickness, which is shorter than the first resist, within the thin conductor formation space and the thick conductor formation space;

a second masking process of filling an opening of the thin conductor formation space with a second resist, thereby covering the plated layer within the thin conductor formation space;

a second plating process of forming an additional plated layer having a second thickness for the thick conductor portion on the plated layer within the thick conductor formation space, after the second masking process; and a process of removing the first resist and the second resist after the second plating process.

6. A flexure mounted on a load beam of a disk drive suspension, the flexure comprising:

a metal base formed of a stainless-steel plate; and a conductive circuit portion arranged along the metal base, the conductive circuit portion comprising:

an insulating layer formed of an electrically insulating material and formed on the metal base; and a conductor formed on the insulating layer, the conductor comprising:

a thin conductor portion formed in a first region which constitutes a part of the conductive circuit portion in a longitudinal direction; and a thick conductor portion formed in a second region which constitutes another part of the conductive circuit portion in the longitudinal direction, a thickness of the thick conductor portion being greater than that of the thin conductor portion, wherein:

the load beam comprises a pair of hinge portions; and the conductive circuit portion includes a flexible conductive circuit portion arranged between the hinge portions, the flexible conductive circuit portion comprising the thin conductor portion.

* * * * *